United States Patent
Yang

(10) Patent No.: US 9,899,327 B2
(45) Date of Patent: Feb. 20, 2018

(54) SURFACE TREATMENT FOR SEMICONDUCTOR STRUCTURE

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/192,499

(22) Filed: Jun. 24, 2016

(65) Prior Publication Data
US 2017/0373013 A1    Dec. 28, 2017

(51) Int. Cl.
  *H01L 21/768*    (2006.01)
  *H01L 23/532*    (2006.01)
  *H01L 23/528*    (2006.01)

(52) U.S. Cl.
  CPC .. *H01L 23/53238* (2013.01); *H01L 21/76829* (2013.01); *H01L 21/76832* (2013.01); *H01L 21/76883* (2013.01); *H01L 23/5283* (2013.01); *H01L 23/53219* (2013.01); *H01L 23/53228* (2013.01)

(58) Field of Classification Search
  CPC ......... H01L 21/76829; H01L 21/76832; H01L 21/76883
  See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,383,920 B1 | 5/2002 | Wang et al. | |
| 6,429,519 B1 | 8/2002 | Uzoh | |
| 7,981,483 B2* | 7/2011 | Russell | H01L 21/76829 250/492.21 |
| 8,358,007 B2* | 1/2013 | Sohn | H01L 21/76832 257/741 |
| 2012/0045615 A1* | 2/2012 | Kirkpatrick | H01J 37/05 428/141 |
| 2013/0113102 A1* | 5/2013 | Bao | H01L 21/76843 257/751 |
| 2014/0024212 A1* | 1/2014 | Ryan | H01L 21/76883 438/643 |

* cited by examiner

*Primary Examiner* — Cuong Q Nguyen
(74) *Attorney, Agent, or Firm* — Louis J. Percello; Ryan, Mason & Lewis, LLP

(57) ABSTRACT

A method includes forming a dielectric layer and forming a metallic conductor at least partially in the dielectric layer. Formation of the metallic conductor at least partially in the dielectric layer includes performing a planarization process. The method further includes treating respective surface areas of the dielectric layer and the metallic conductor, after the planarization process, to modify the respective surface areas of the dielectric layer and the metallic conductor. In one example, the surface treatment is a neutral atom beam treatment.

12 Claims, 5 Drawing Sheets

200

200

200

200

SURFACE TREATMENT FOR SEMICONDUCTOR STRUCTURE

BACKGROUND

Damage to the surface of a dielectric layer in a semiconductor structure following a chemical-mechanical planarization (CMP) process is often observed and causes a negative impact on the reliability of one or more interconnects (metallic conductors) formed in the semiconductor structure. This damage is typically caused by the polishing fluid used during the CMP process, and is critically adverse when the dielectric layer is formed with an ultra-low-k (ULK) dielectric material, where k represents the dielectric constant.

Further, an alloy element (e.g., based on aluminum (Al), manganese (Mn), etc.) has been implemented in advanced copper (Cu) interconnects of semiconductor structures for electromigration (EM) resistance enhancement. EM is the movement of ions in a conductor due to the momentum transfer between conducting electrons and diffusing metal atoms, which can lead to reduced performance and even failure of interconnects. However, it has been observed that the lack of alloy element segregation onto the Cu surface degrades the EM resistance enhancement otherwise expected by the introduction of the alloy element.

SUMMARY

Embodiments provide techniques for treating one or more surfaces of a semiconductor structure.

For example, in one embodiment, a method comprises forming a dielectric layer and forming a metallic conductor at least partially in the dielectric layer. Formation of the metallic conductor at least partially in the dielectric layer comprises performing a planarization process. The method further comprises treating respective surface areas of the dielectric layer and the metallic conductor, after the planarization process, to modify the respective surface areas of the dielectric layer and the metallic conductor.

More particularly, in one embodiment, a method for treating one or more surface areas of a semiconductor structure comprises applying at least one surface treatment technique that remedies the above-mentioned and other drawbacks associated with the CMP process and with EM resistance enhancement. In one example, the surface treatment is a neutral atom beam treatment. An improved semiconductor structure is thereby formed.

DETAILED DESCRIPTION

In illustrative embodiments, techniques are provided for interconnect fabrication in a semiconductor structure. More particularly, illustrative embodiments provide one or more surface treatment techniques that remedy the above-mentioned and other drawbacks associated with the CMP process and with EM resistance enhancement. As will be explained in illustrative embodiments, such surface treatment may include, but is not limited to: neutral atom beam treatment, ion implantation treatment, plasma bombardment treatment, gas cluster ion beam treatment, combinations thereof, or any similar particle (charged or non-charged) based treatment.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

Figure 1A:
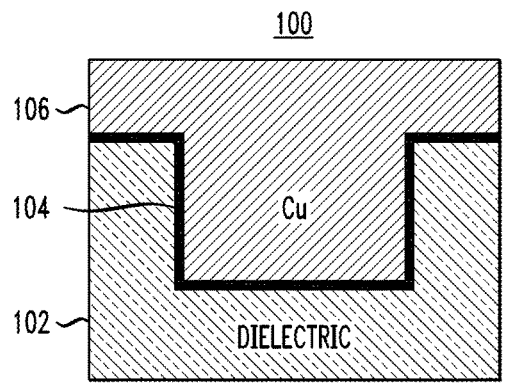
FIG. 1A is a schematic cross-sectional side view of a portion of a semiconductor structure following a metallization stage of an interconnect fabrication process, according to an embodiment of the invention.
Figure 1B:
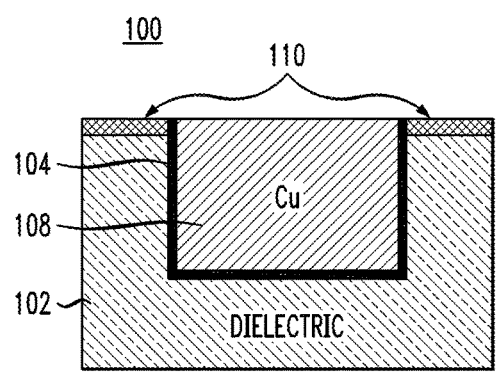
FIG. 1B is a schematic cross-sectional side view of the portion of the semiconductor structure of FIG. 1A following a chemical-mechanical planarization stage of the interconnect fabrication process.
Figure 1C:
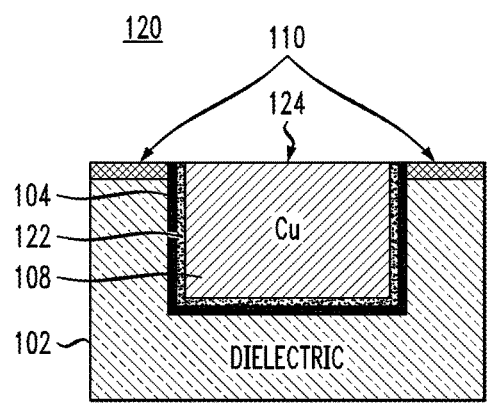
FIG. 1C is a schematic cross-sectional side view of an alternative implementation of the portion of the semiconductor structure of FIG. 1B which includes an alloy element layer deposited between the dielectric layer and the copper interconnect layer to provide electromigration resistance enhancement.

FIGS. 1A and 1B illustrate in more detail the above-mentioned damage associated with the CMP process, while FIG. 1C illustrates the above-mentioned shortcomings associated with EM resistance enhancement, in fabricating interconnects of a semiconductor structure.

More particularly, FIG. 1A shows a semiconductor structure 100 following a metallization stage of an interconnect fabrication process. During the interconnect fabrication process, an insulating layer (dielectric) 102 is patterned with an open trench within which a metallic conductor (interconnect) is formed. A liner layer 104 may be deposited in the open trench prior to the metallization process. The liner layer 104 may be formed, by way of example only, by reactive sputtering of tantalum (Ta) or tantalum nitride (TaN) in the trench to form the liner layer 104 shown in FIG. 1A. Other materials that can be used to form the liner layer 104 include, but are not limited to, titanium (Ti), tungsten (W), cobalt (Co), ruthenium (Ru), iridium (Ir), rhodium (Rh), and their nitride materials.

Then, a thick coating of Cu that significantly overfills the trench is deposited (copper plating process) on the insulator (on top of the liner layer 104). This Cu coating is depicted as layer 106 in FIG. 1A. The portion of the Cu coating that extends above the trench and on top of the dielectric layer 104 is referred to as the overburden.

Chemical-mechanical planarization (CMP) is used to remove the overburden and the liner 104 on the field area, while the copper within the trench of the insulating layer 102 is not removed and, as depicted in FIG. 1B, becomes the patterned metallic conductor or interconnect 108.

The process described above is typically referred to as a single damascene process (or, simply, a damascene process) since a single feature is formed and filled with copper. In contrast, a dual-damascene process generally forms and fills two features with copper at once, e.g., a trench overlying a via may both be filled with a single copper deposition using a dual-damascene process. With successive layers of insulator and copper, a multilayer (e.g., 5-10 metal layers or more) interconnection structure is created.

However, as mentioned above, following the CMP process, damage to the surface of the dielectric layer 102 is often observed and causes a negative impact on the reliability of the interconnect 108. The damaged surface portion of dielectric layer 102 is shown in FIG. 1B as surface area 110. The damage is typically caused by the polishing fluid used during the CMP process to remove the liner 104 from the field area. ULK dielectric material tends to be particularly susceptible to this type of CMP damage. The CMP damage may be chemical in nature (however, physical damage may also occur). In the case of chemical damage, the dielectric layer 102 within the surface areas 110 is depleted of certain elements depending on the composition of the dielectric layer. For example, in the case of a ULK dielectric layer, the percent content of nitrogen (N), hydrogen (H), carbon (C), and/or silicon (Si) may be reduced as a result of the CMP process. Such damage in surface area 110 can have an adverse effect on the proper operation of the interconnect 108. More specifically, it has been observed that damaged chemical bonding degrades dielectric breakdown strength of the insulator and directly impacts reliability of the interconnects. Further, it has also observed that elemental depletion in a ULK insulator increase its dielectric constant and directly degrades performance of the interconnect because of the RC increase.

FIG. 1C shows an alternative implementation of the semiconductor structure from FIG. 1B, denoted here as semiconductor 120, which includes an alloy element layer 122 deposited between the dielectric layer 102 and the copper interconnect layer 108 (more particularly, layer 122 is deposited on the liner layer 104) to provide electromigration resistance enhancement. As mentioned above, electromigration or EM is the movement of ions in a conductor due to the momentum transfer between conducting electrons and diffusing metal atoms, which can cause void failures along the internal length of the interconnect as well as diffusive displacements at the periphery of the interconnect that destroy electrical contact.

One EM resistance enhancement is to deposit an alloy element layer in the trench in which a Cu interconnect is to be formed. Such an alloy element layer 122 is shown in FIG. 1C as 122. Alloy element layer 122 may be formed as an alloy copper seeding layer comprising, by way of example, copper manganese (CuMn) or copper aluminum (CuAl).

The alloy element layer can be deposited using one or more conventional deposition processes. However, it has been observed that the lack of alloy element segregation onto the Cu surface, depicted as surface area 124 in FIG. 1C, reduces the benefits sought to be achieved by the introduction of the alloy element. Semiconductor structure 120 also depicts the CMP damaged surface area 110 of the dielectric layer 102.

Illustrative embodiments provide one or more surface treatment techniques that remedy the above-mentioned and other drawbacks associated with the CMP process and with EM resistance enhancement. FIGS. 2A-2J illustrate various stages of an improved interconnect fabrication process, according to embodiments of the present invention. As such, FIGS. 2A-2J also collectively serve as a flow diagram illustrating portions of one or more embodiments of a method for fabricating a semiconductor structure 200. It is to be understood that, for the sake of clarity of illustration, while the figures depict fabrication of a single interconnect, the steps of the process of FIGS. 2A-2J are applicable for fabricating multiple such interconnects on a semiconductor structure that is part of a semiconductor device, e.g., a complementary metal oxide semiconductor (CMOS) device. Also, the portion of the semiconductor structure 200 shown may also be part of an integrated circuit. Thus, reference numeral 200 is understood to reference a semiconductor structure, a semiconductor device, and/or an integrated circuit.

Figure 2A:
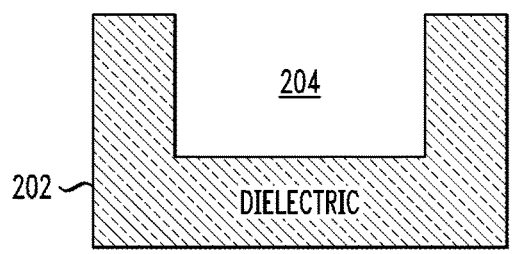
FIG. 2A is a schematic cross-sectional side view of a portion of a semiconductor structure at a first-intermediate interconnect fabrication stage, according to an embodiment of the invention.

In particular, FIG. 2A illustrates the semiconductor structure 200 at a first intermediate stage in the processing. For the purpose of clarity, several fabrication steps leading up to the production of the semiconductor structure 200 as illustrated in FIG. 2A are omitted. In other words, the semiconductor structure 200 does not necessarily start out in the form illustrated in FIG. 2A, but may develop into the illustrated structure over one or more well-known processing steps which are not illustrated but are well-known to those of ordinary skill in the art.

Figure 2B:
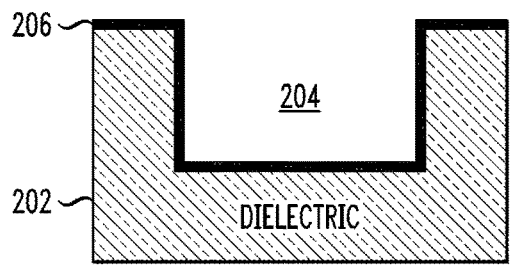
FIG. 2B is a schematic cross-sectional side view of a portion of a semiconductor structure at a second-intermediate interconnect fabrication stage, according to an embodiment of the invention.
Figure 2C:
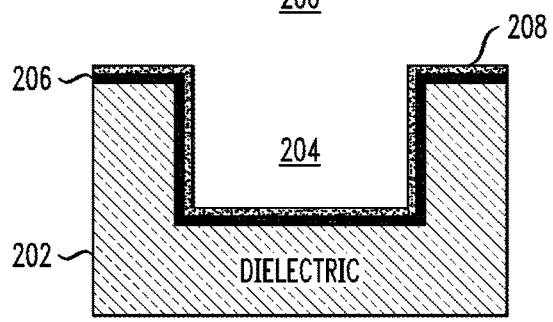
FIG. 2C is a schematic cross-sectional side view of a portion of a semiconductor structure at a third-intermediate interconnect fabrication stage, according to an embodiment of the invention.
Figure 2D:
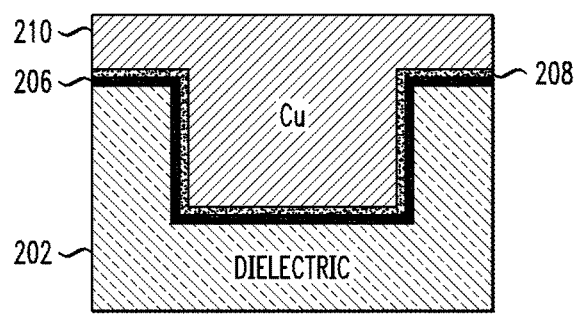
FIG. 2D is a schematic cross-sectional side view of a portion of a semiconductor structure at a fourth-intermediate interconnect fabrication stage, according to an embodiment of the invention.

As shown in FIG. 2A, dielectric layer 202 has an open trench 204 formed therein. The trench may be etched into the dielectric layer using conventional trench formation techniques. This process is similar to that described above with respect to dielectric layer 102. FIG. 2B shows deposition of a liner layer 206. This liner layer can be similarly formed as explained above with respect to liner layer 104. Formation of an alloy element layer 208 is shown in FIG. 2C. This EM resistance enhancement layer can be similarly formed as explained above with respect to allow element layer 122. FIG. 2D shows a thick Cu coating depicted as layer 210 that significantly overfills the trench is deposited on top of the alloy element layer 208. Again, the portion of the Cu coating that extends above the trench and on top of the dielectric layer is referred to as the overburden.

Figure 2E:
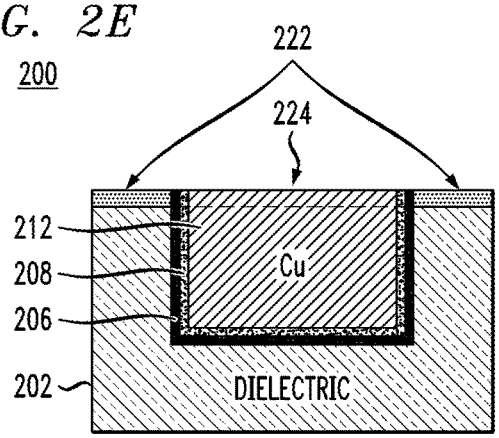
FIG. 2E is a schematic cross-sectional side view of a portion of a semiconductor structure at a fifth-intermediate interconnect fabrication stage, according to an embodiment of the invention.

FIG. 2E shows the result of the CMP process, similar to semiconductor structure 120 in FIG. 1C. As shown, following CMP, Cu layer 212 remains within the lined trench, forming the Cu interconnect. Surface area 222 of the dielectric layer 202 is depleted of certain elements and, as such, is damaged as a result of the CMP process. Similarly, surface area 224 of the Cu interconnect 212 (illustratively defined by the dashed line) lacks the alloy element of layer 208.

As explained above, illustrative embodiments provide one or more surface treatment techniques that remedy the above-mentioned and other drawbacks associated with the CMP process and with EM resistance enhancement. Such surface treatment may include, but is not limited to: neutral atom beam treatment, ion implantation treatment, plasma bombardment treatment, gas cluster ion beam treatment, or any similar particle (charged or non-charged) based treatment.

Figure 2F:
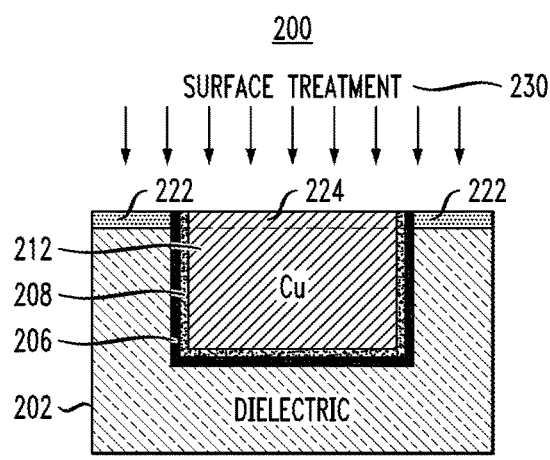
FIG. 2F is a schematic cross-sectional side view of a portion of a semiconductor structure at a sixth-intermediate interconnect fabrication stage, according to an embodiment of the invention.
Figure 2G:
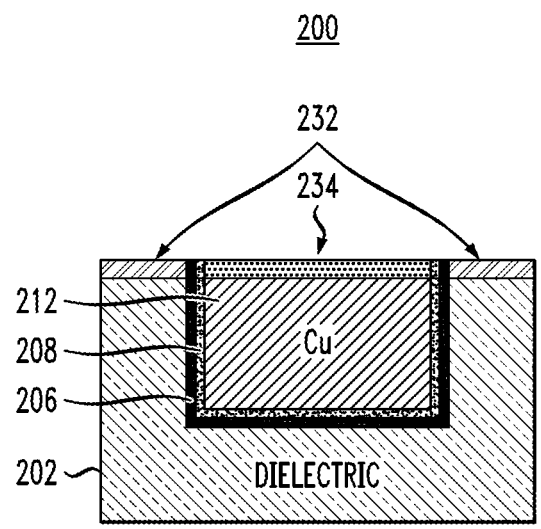
FIG. 2G is a schematic cross-sectional side view of a portion of a semiconductor structure at a seventh-intermediate interconnect fabrication stage, according to an embodiment of the invention.

FIG. 2F shows the application of a surface treatment 230 in accordance with an illustrative embodiment. For example, in one illustrative embodiment, surface treatment 230 comprises an neutral atom beam (NAB) treatment, which provides at least two forms of remediation for the semiconductor structure 200. First, application of the NAB treatment densifies the damaged surface area 222 of dielectric layer 202 by increasing the percent content of N, H, C, and/or Si (reduced as a result of the CMP process) in the dielectric layer 202. Second, application of the NAB treatment creates point defects at surface area 224 of the Cu interconnect 212. These point defects, as will be further explained, promote or encourage segregation of the alloy element from alloy element layer 208 onto the Cu surface area 224 during an annealing process. FIG. 2G shows the densified surface area 232 of the dielectric layer 202 and the point defects created in the Cu surface area 234, following the NAB treatment.

NAB treatment is an ultra-shallow processing technique that uses a system which employs conversion of energetic gas cluster ions produced by the gas cluster ion beam (GCIB) method into intense collimated beams of coincident neutral gas atoms. These neutral gas atoms (particles) have controllable average energies from less than 10 eV per atom to beyond 100 electron volts (eV) per atom. A beam of gas cluster ions is first produced using a typical GCIB process. However, conditions within the source ionizer and extraction regions are adjusted such that immediately after ionization and acceleration the clusters undergo collisions with non-ionized gas atoms. Energy transfer during these collisions causes the energetic cluster ions to release many of their constituent atoms. An electrostatic deflector is then used to eliminate charged species, leaving the released neutral atoms to still travel collectively at the same velocities they had as bonded components of their parent clusters. It is to be understood that the system that provides the NAB treatment is not shown for simplicity. Any conventional NAB system may be employed.

Upon target impact, in this case, the damaged surface area 222 of the dielectric layer 202 and the surface area 224 of the Cu interconnect 212, the neutral atom beams produce the remedial effects described herein at depths of between 1-3 nanometers (nm). This NAB treatment has similar impact as ion implementation related processes to "inject" elements into substrates. With the NAB treatment, on the damaged dielectric surface, the injected chemical element(s), for example, N, C, Si, and/or H, form new chemical bondings and repairs the structure. By repaired, it is meant that the dielectric layer can be made denser with respect to the injected elements as compared to the density of the original (pre-planarization) bulk dielectric material, or it can be returned to its original density or substantially close to its original density. On the metal surface, the injected chemical element(s) create point defects. A main preferred feature of NAB is the "controlled" treatment of depth about 1~3 nm, which cannot be achieved by the typical ion implementation related processes. In one illustrative embodiment, the NAB operating conditions comprise: low energy particles of about 10~100 eV, an operation temperature of about 25~400 degrees Celsius, and an operation time of about 10 seconds~10 minutes.

Figure 2H:
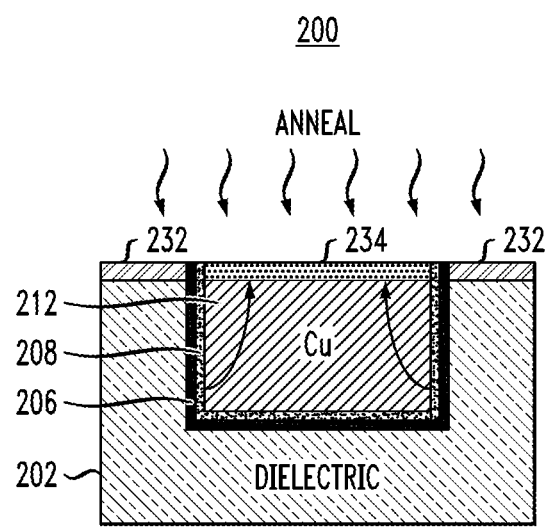
FIG. 2H is a schematic cross-sectional side view of a portion of a semiconductor structure at an eighth-intermediate fabrication stage, according to an embodiment of the invention.
Figure 2I:
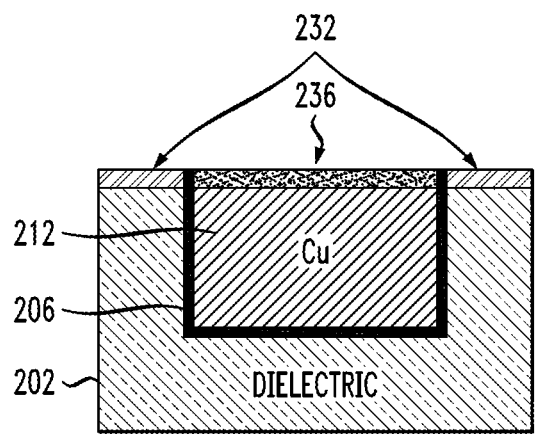
FIG. 2I is a schematic cross-sectional side view of a portion of semiconductor structure at a ninth-intermediate interconnect fabrication stage, according to an embodiment of the invention.

FIG. 2H shows a thermal annealing step performed on semiconductor structure 200. The thermal annealing step may comprise introduction of heat energy via a conventional furnace/hot plate system operating at a temperature ranging between about 100 to 400 degrees Celsius for a duration of about 20 minutes to 3 hours. An alternative thermal annealing step can be performed using a laser annealing system operating at a temperature ranging between about 400 to 800 degrees Celsius for a duration of about 10 nanoseconds to 5 minutes. In illustrative embodiments, the ambient environment during the thermal annealing step may be pure nitrogen ($N_2$) or a nitrogen/hydrogen ($H_2$) mixture. During the thermal annealing process, alloy elements from layer 208, encouraged by the point defects created during the NAB treatment, segregate from layer 208 and migrate to the Cu interconnect surface (as illustrated by the arrows in FIG. 2H). The structure shown in FIG. 2H is not thermodynamically stable in terms of the existing point defects on the Cu metal surface. In order to reach an equilibrium, the point defects are refilled (or repair the damage sites) in order to lower the total system energy. A high temperature annealing step accelerates the process. In addition to higher mobility than Cu, Mn oxide has a lower entropy than Cu oxide (Mn easily reacts with oxygen; forming Mn oxide reduces more free energy than forming Cu oxide). FIG. 2I shows the results of the alloy element movement whereby the surface area of the Cu interconnect 212 now is comprised of the alloy element previously part of layer 208. The improved surface area of the Cu interconnect is denoted as 236 in FIG. 2I.

Figure 2J:
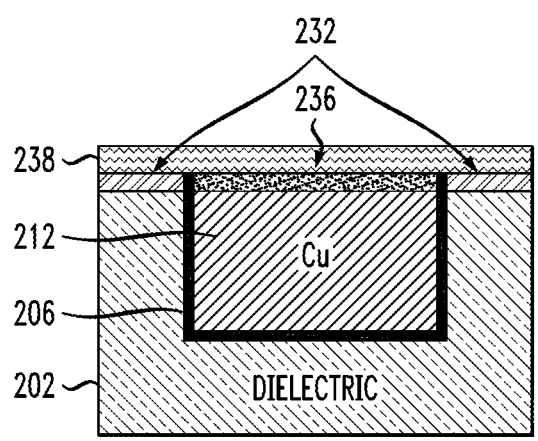
FIG. 2J is a schematic cross-sectional side view of a portion of a semiconductor structure at a tenth-intermediate interconnect fabrication stage, according to an embodiment of the invention.

FIG. 2J shows deposition of a capping layer 238. The capping layer may be deposited in a conventional manner and, in one illustrative embodiment, may comprise a SiC(N, H) material which is a N—H doped silicon carbide material also known as NBLoK. However, other capping materials may be used in alternative embodiments.

In an alternative embodiment, the ordering of the thermal annealing step and the capping layer deposition can be reversed (i.e., the capping layer is deposited and then the thermal annealing step is applied).

Advantageously, illustrative embodiments provide processing techniques that: modify the interconnect surface post planarization via neutral atom beam treatment; achieve in-situ dielectric surface densification and point defect creation within the controlled Cu surface; and deposit NBLoK and form an alloy element on the Cu surface. The semiconductor structure that results from the various processing steps performed in accordance with illustrative embodiments comprises a densified dielectric surface with higher contents of N, H, Si, C, etc. than the bulk material. Furthermore, the same elements may also exist on the Cu surface. However, during the NBLoK deposition process, the majority (if not all) of these elements are removed.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of forming a semiconductor structure, comprising steps of:
   forming a dielectric layer;
   forming a metallic conductor at least partially in the dielectric layer, wherein formation of the metallic conductor at least partially in the dielectric layer comprises performing a planarization process;
   treating respective surface areas of the dielectric layer and the metallic conductor, after the planarization process, to modify the respective surface areas of the dielectric layer and the metallic conductor, and
   applying a thermal annealing process to the semiconductor structure after the treating step,
   wherein the treating step comprises applying neutral atom beams to the respective surface areas of the dielectric layer and the metallic conductor, and further wherein the neutral atom beam application introduces one or more chemical elements into the respective surface areas of the dielectric layer and the metallic conductor,
   wherein, for the surface area of the metallic conductor, the introduced one or more chemical elements create point defects in the surface area of the metallic conductor.

2. The method of claim 1, further comprising forming a capping layer over the modified respective surface areas of the dielectric layer and the metallic conductor.

3. The method of claim 2, wherein the capping layer forming step is performed after the thermal annealing step.

4. The method of claim 2, wherein the capping layer forming step is performed before the thermal annealing step.

5. The method of claim 1, wherein the thermal annealing process causes alloy elements present between the dielectric layer and the metallic conductor to segregate to the point defects in the surface area of the metallic conductor.

6. The method of claim 5, wherein the modified surface area of the metallic conductor increases resistance to electromigration within the metallic conductor.

7. The method of claim 5, wherein the alloy elements comprise aluminum.

8. The method of claim 5, wherein the alloy elements comprise manganese.

9. The method of claim 1, wherein the step of applying neutral atom beams to the respective surface areas of the dielectric layer and the metallic conductor modifies the respective surface areas to a depth of about one to three nanometers.

10. The method of claim 1, wherein the step of applying neutral atom beams to the respective surface areas of the dielectric layer and the metallic conductor comprises operating conditions including low energy particles of about 10 to 100 electron volts, an operation temperature of about 25 to 400 degrees Celsius, and an operation time of about 10 seconds to 10 minutes.

11. The method of claim 1, wherein the metallic conductor comprises copper.

12. The method of claim 1, wherein the dielectric layer comprises an ultra-low k dielectric material.

* * * * *